United States Patent
Cook et al.

(10) Patent No.: US 9,226,433 B2
(45) Date of Patent: Dec. 29, 2015

(54) SELECTIVELY CONDUCTIVE EMI GASKETS

(71) Applicant: Laird Technologies, Inc., Earth City, MO (US)

(72) Inventors: Kelly Cook, St. Louis, MO (US); Tomas Hrcek, Praha (CZ); Michael Poulsen, House Springs, MO (US); Sri Talpallikar, Hong Kong (HK)

(73) Assignee: Laird Technologies, Inc., Earthy City, MO (US)

( * ) Notice: Subject to any disclaimer, the term of this patent is extended or adjusted under 35 U.S.C. 154(b) by 0 days.

(21) Appl. No.: 14/537,606

(22) Filed: Nov. 10, 2014

(65) Prior Publication Data

US 2015/0090486 A1 Apr. 2, 2015

Related U.S. Application Data

(63) Continuation-in-part of application No. 13/832,466, filed on Mar. 15, 2013, now Pat. No. 8,884,168.

(51) Int. Cl.
| | |
|---|---|
| *H05K 9/00* | (2006.01) |
| *B32B 5/24* | (2006.01) |
| *B32B 7/12* | (2006.01) |
| *B32B 27/12* | (2006.01) |
| *B32B 27/36* | (2006.01) |
| *B32B 1/08* | (2006.01) |
| *B32B 3/04* | (2006.01) |
| *B29C 63/04* | (2006.01) |

(52) U.S. Cl.
CPC ............... *H05K 9/0015* (2013.01); *B32B 1/08* (2013.01); *B32B 3/04* (2013.01); *B32B 5/245* (2013.01); *B32B 7/12* (2013.01); *B32B 27/12* (2013.01); *B32B 27/36* (2013.01); *B29C 63/044* (2013.01); *B32B 2250/44* (2013.01); *B32B 2255/02* (2013.01); *B32B 2255/205* (2013.01); *B32B 2266/0278* (2013.01); *B32B 2307/206* (2013.01); *B32B 2307/212* (2013.01); *B32B 2307/302* (2013.01); *Y10S 277/92* (2013.01)

(58) Field of Classification Search
CPC .................................................... H05K 9/0015
See application file for complete search history.

(56) References Cited

U.S. PATENT DOCUMENTS

| | | | |
|---|---|---|---|
| 4,720,606 | A | 1/1988 | Senn |
| 5,202,536 | A | 4/1993 | Buonanno |
| 5,511,798 | A | 4/1996 | Kawamoto et al. |

(Continued)

FOREIGN PATENT DOCUMENTS

| | | |
|---|---|---|
| EP | 0531076 | 3/1993 |
| EP | 0967019 | 12/1999 |

(Continued)

OTHER PUBLICATIONS www.lairdtech.com; 603 Gaskets EcoTemp125 Fabric-over-Foam; 2012 ©; 2 pgs.

*Primary Examiner* — Hung V Ngo
(74) *Attorney, Agent, or Firm* — Harness, Dickey & Pierce, P.L.C.

(57) ABSTRACT

A fabric over foam electromagnetic interference gasket has a body of indefinite length, and includes a layer of dielectric material thereon. The gasket may be compressed between two substrates and provide electrical conductivity in one axis and EMI shielding and nonconductivity in a perpendicular axis.

19 Claims, 5 Drawing Sheets

(56) References Cited

U.S. PATENT DOCUMENTS

| | | | |
|---|---|---|---|
| 5,581,048 A * | 12/1996 | Shores | 174/356 |
| 5,656,795 A | 8/1997 | Miska | |
| 5,727,795 A | 3/1998 | Plunkett | |
| 5,804,762 A | 9/1998 | Jones et al. | |
| 6,075,205 A | 6/2000 | Zhang | |
| 6,483,023 B1 | 11/2002 | Jacques et al. | |
| 6,525,267 B1 * | 2/2003 | Worley et al. | 174/370 |
| 6,534,706 B1 | 3/2003 | Rapp et al. | |
| 6,613,976 B1 | 9/2003 | Benn, Jr. | |
| 6,621,000 B2 | 9/2003 | Jensen et al. | |
| 6,774,301 B1 | 8/2004 | Kordes et al. | |
| 6,943,288 B1 | 9/2005 | Miska | |
| 7,078,614 B1 | 7/2006 | van Haaster | |
| 7,084,344 B1 | 8/2006 | Gilliland et al. | |
| 7,112,740 B2 | 9/2006 | van Haaster | |
| 7,763,810 B2 | 7/2010 | van Haaster | |
| 2003/0051891 A1 | 3/2003 | Rapp et al. | |
| 2003/0209355 A1 | 11/2003 | Jensen et al. | |
| 2006/0272855 A1 | 12/2006 | Rutherford et al. | |
| 2007/0011693 A1 | 1/2007 | Creasy, Jr. | |
| 2009/0000818 A1 | 1/2009 | Poulsen | |
| 2009/0114438 A1 | 5/2009 | Van Haaster | |
| 2014/0262471 A1 | 9/2014 | Cook et al. | |

FOREIGN PATENT DOCUMENTS

| | | |
|---|---|---|
| EP | 1052887 | 11/2000 |
| EP | 1158846 | 11/2001 |
| EP | 1701605 | 9/2006 |
| WO | WO 99/22555 A1 | 5/1999 |
| WO | WO01/54467 | 7/2001 |
| WO | WO 2005/122665 | 12/2005 |

* cited by examiner

SELECTIVELY CONDUCTIVE EMI GASKETS

CROSS-REFERENCE TO RELATED APPLICATION

This application is a continuation-in-part of U.S. patent application Ser. No. 13/832,466 filed Mar. 15, 2013. The entire disclosure of this application is incorporated herein by reference.

FIELD

The present disclosure generally relates to electromagnetic interference gaskets.

BACKGROUND

This section provides background information related to the present disclosure which is not necessarily prior art.

During normal operation, electronic equipment can generate undesirable electromagnetic energy that can interfere with the operation of proximately located electronic equipment due to electromagnetic interference (EMI) transmission by radiation and conduction. The electromagnetic energy can be of a wide range of wavelengths and frequencies. To reduce the problems associated with EMI, sources of undesirable electromagnetic energy may be shielded and electrically grounded. Shielding can be designed to prevent both ingress and egress of electromagnetic energy relative to a housing or other enclosure in which the electronic equipment is disposed. Since such enclosures often include gaps or seams between adjacent access panels and around doors and connectors, effective shielding can be difficult to attain because the gaps in the enclosure permit transference of EMI therethrough. Further, in the case of electrically conductive metal enclosures, these gaps can inhibit the beneficial Faraday Cage Effect by forming discontinuities in the conductivity of the enclosure which compromise the efficiency of the ground conduction path through the enclosure. Moreover, by presenting an electrical conductivity level at the gaps that is significantly different from that of the enclosure generally, the gaps can act as slot antennae, resulting in the enclosure itself becoming a secondary source of EMI.

EMI gaskets have been developed for use in gaps and around doors to provide a degree of EMI shielding while permitting operation of enclosure doors and access panels and fitting of connectors. To shield EMI effectively, the gasket should be capable of absorbing or reflecting EMI as well as establishing a continuous electrically conductive path across the gap in which the gasket is disposed. These gaskets can also be used for maintaining electrical continuity across a structure and for excluding from the interior of the device such contaminates as moisture and dust. Once installed, the gaskets essentially close or seal any interface gaps and establish a continuous electrically-conductive path thereacross by conforming under an applied pressure to irregularities between the surfaces. Accordingly, gaskets intended for EMI shielding applications are specified to be of a construction that not only provides electrical surface conductivity even while under compression, but which also has a resiliency allowing the gaskets to conform to the size of the gap.

As used herein, the term "EMI" should be considered to generally include and refer to EMI emissions and RFI emissions, and the term "electromagnetic" should be considered to generally include and refer to electromagnetic and radio frequency from external sources and internal sources. Accordingly, the term shielding (as used herein) generally includes and refers to EMI shielding and RFI shielding, for example, to prevent (or at least reduce) ingress and egress of EMI and RFI relative to a housing or other enclosure in which electronic equipment is disposed.

SUMMARY

This section provides a general summary of the disclosure, and is not a comprehensive disclosure of its full scope or all of its features.

Embodiments are provided of EMI shields, such as EMI gaskets. The gasket has a body of indefinite length. One exemplary embodiment includes a gasket that is compressible between two substrates having generally parallel respective surfaces. The gasket may include a foam core surrounded by electrically-conductive fabric. In an embodiment, the gasket may include a layer of nonconductive material on the outermost portion of the gasket, running the length of the gasket, the layer being one or more strips of nonconductive material. In an embodiment, the gasket may be electrically conductive in one axis and nonconductive in a perpendicular axis.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

DETAILED DESCRIPTION

Example embodiments will now be described more fully with reference to the accompanying drawings.

In various exemplary embodiments, an electromagnetic interference fabric-over-foam gasket of indefinite length is provided that is deflectable into a collapsed orientation between first and second substrates. In such embodiments, the gasket further includes a layer of dielectric material that runs the length of the gasket. The layer of dielectric material may be adhered to the gasket such that conductivity may be achieved between first and second substrates, defined by a first axis, and the gasket is non-conductive in a second perpendicular axis, where the length of a segment of the gasket is a third orthogonal axis.

Figure 1A:
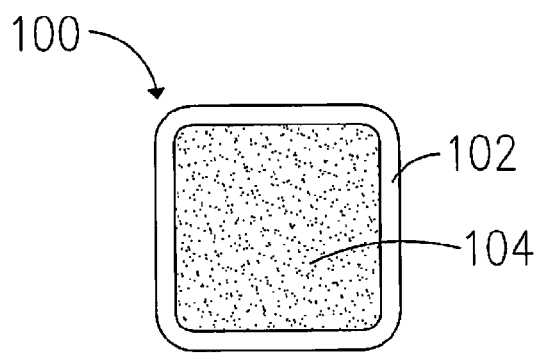
FIG. 1A depicts a cross-sectional view of a conventional generally rounded-edge square-shaped fabric-over-foam (FOF) EMI gasket.
Figure 1B:
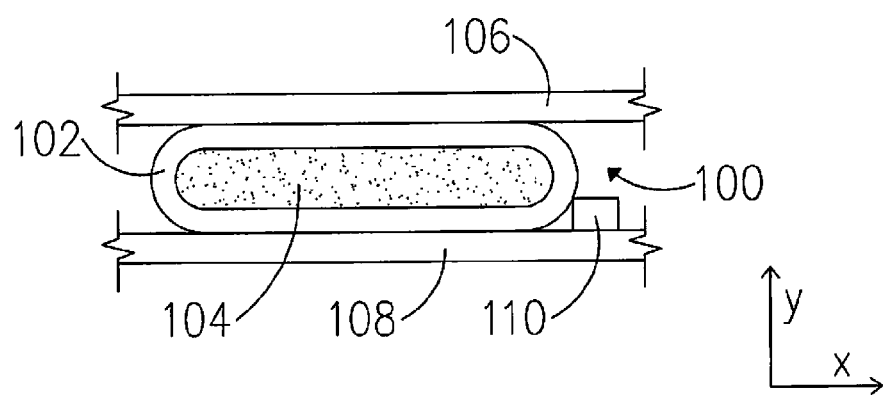
FIG. 1B depicts a cross-sectional view of the conventional gasket of FIG. 1A, having been compressed between two opposing generally planar parallel substrates.

Turning to the Figures, FIGS. 1A and 1B show a conventional generally rounded-edge square-shaped fabric-over-foam (FOF) EMI gasket 100. Such a typical gasket 100 includes a resilient core member 104 (e.g., compressible foam, etc.) and an electrically-conductive outer layer 102 coupled to the resilient core member. The gasket of FIG. 1A may be compressed between two opposing generally-planar parallel substrates 106, 108, resulting in the compressed gasket 100 of FIG. 1B.

Once compressed, the gasket of FIG. 1B permits conductivity between the two substrates 106, 108, and provides EMI shielding across the compressed gasket 100. In the course of compression, the width of the gasket may expand outwardly in one or more directions along the x axis as the gasket is compressed in another perpendicular direction along the y axis. In certain applications, for example where space on a printed circuit board (PCB) is at a premium and the gasket is surrounded by other electrical components 110, it is undesirable for the gasket to be conductive in all directions. As the gasket 100 of FIG. 1A is compressed into the gasket of FIG. 1B, the related expansion along the x axis can create undesired electrical contacts with adjacent electrical components 110.

Figure 2A:
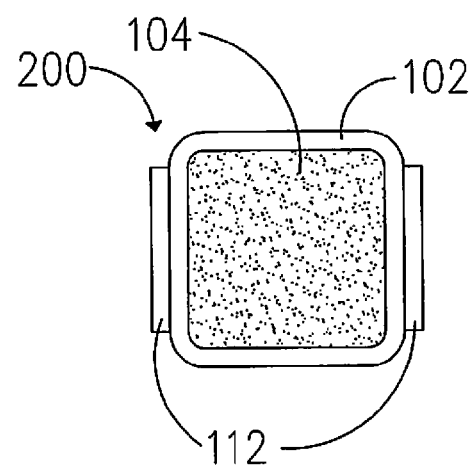
FIG. 2A depicts a cross-sectional view of an embodiment of a generally rounded-edge square-shaped FOF EMI gasket having nonconductive material thereon, this gasket being in a non-compressed state.

FIG. 2A depicts a cross-sectional view of an embodiment of a generally rounded-edge square-shaped FOF EMI gasket 200 having nonconductive or dielectric material 112 thereon, this gasket being in a non-compressed state. This gasket 200 has an electrically-conductive layer 102 wrapped around a core 104, similar to the gasket of FIG. 1A, and has a body of indefinite length. In this embodiment, the layer of nonconductive material 112 is two strips of plastic film on opposite sides of the gasket 200, running the length of the gasket body.

Figure 2B:
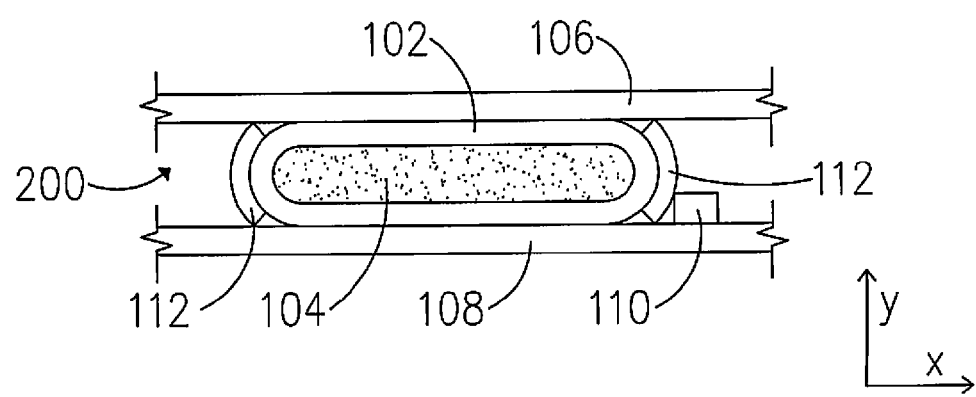
FIG. 2B depicts a cross-sectional view of the gasket shown in FIG. 2A, having been compressed between two opposing generally-planar parallel substrates.

FIG. 2B, depicts a cross-sectional view of the gasket 200 of FIG. 2A, having been compressed between two opposing generally-planar parallel substrates 106, 108. Once compressed, the gasket 200 retains conductivity in the y axis, while remaining dielectric in the x axis. As such, the gasket 200 does not conduct electricity to adjacent electrical components 110 that are contacted upon compression between the two substrates 106, 108.

Figure 3:
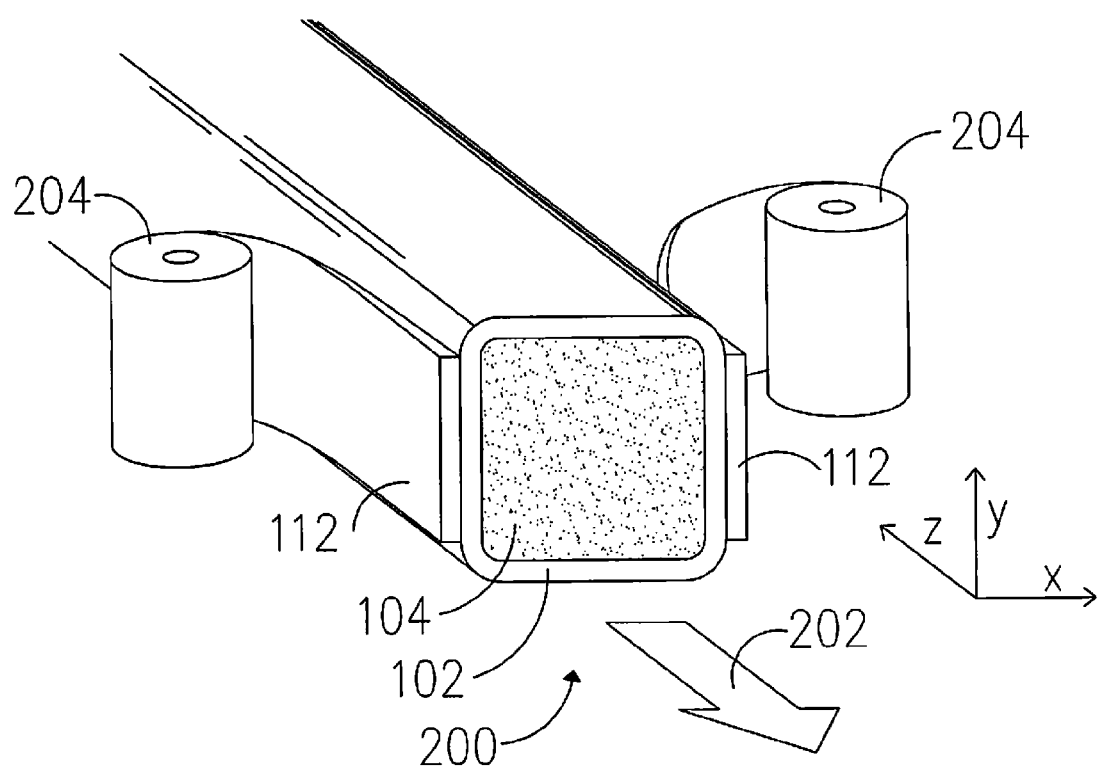
FIG. 3 depicts an embodiment of a method of manufacturing an exemplary embodiment of a generally rounded-edge square-shaped FOF EMI gasket having nonconductive material thereon.

The gasket 200 of FIGS. 2A and 2B may be manufactured by any suitable method, including the embodiment depicted in FIG. 3. In this particular non-limiting embodiment, two strips of dielectric material 112 are fed from respective spools 204 and adhered to the electrically-conductive layer 102 of the gasket 200 as it moves in the production direction 202. Those of ordinary skill in the art would readily recognize other suitable methods for adhering one or more strips of non-conductive material to an FOF gasket.

The resulting gasket 200 of FIG. 3 has an indefinite body length along the z axis, while remaining conductive along the y axis and dielectric along the x axis. Thus the gasket 200 is electrically conductive in one direction (the y axis) perpendicular to the length of the gasket (the z axis), and nonconductive in a second direction (the x axis) perpendicular to both the one direction (y axis) and the length of the gasket (z axis). When compressed between two substrates, the gasket 200 provides electrical conductivity between the substrates (in the y axis).

Figure 4A:
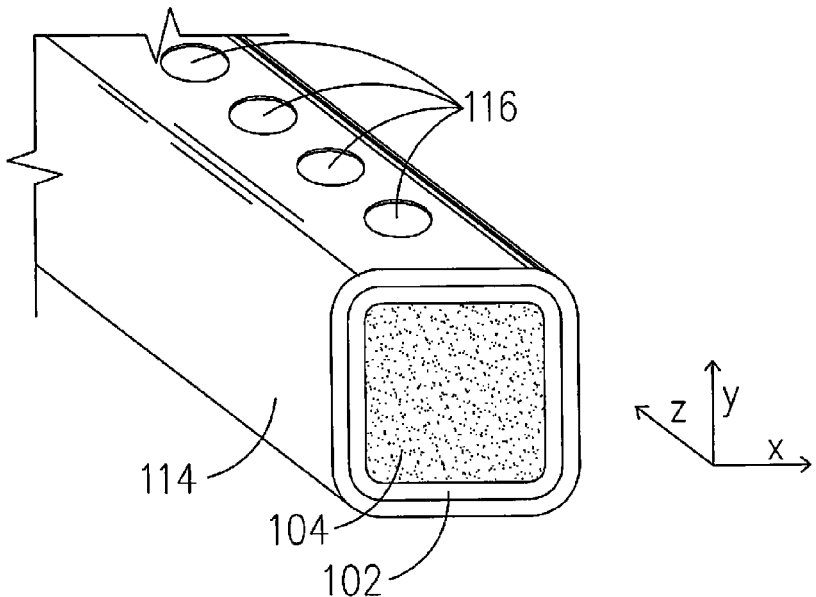
FIG. 4A depicts a perspective cross-sectional view of an alternative embodiment of a generally rounded square shaped FOF EMI gasket having nonconductive material thereon, this gasket being in a non-compressed state.

FIG. 4A shows a perspective cross-sectional view of an alternative embodiment of a generally rounded square shaped FOF EMI gasket 300 having nonconductive material 114 thereon, this gasket being in a non-compressed state. In this embodiment, the gasket 300 has a core 104 surrounded by a layer of electrically-conductive material 102 and a body of indefinite length along the z axis. But distinct from the gasket 200 of FIGS. 2A, 2B and 3, the dielectric or nonconductive layer 114 of this gasket 300 is a single sheet of dielectric material that has been wrapped around the length of the gasket body, where the sheet of dielectric material includes apertures 116 to permit electrical conductivity of the gasket in one direction.

As can be seen in FIG. 4A, the gasket 300 is conductive in the y axis through a series of apertures 116 on opposing sides of the gasket 300. The apertures 116 in FIG. 4A are circles, though they may be of any suitable shape or size, and they may be present in any variety of patterns or frequencies along the length of the gasket body, giving the gasket manufacturer enhanced selectivity of conductivity.

Figure 4B:
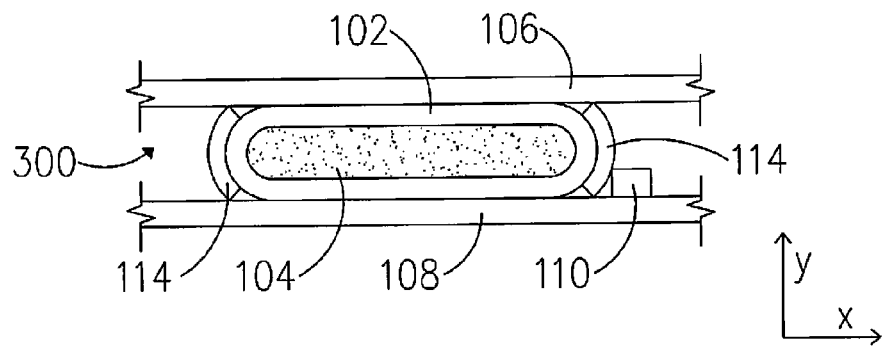
FIG. 4B depicts a cross-sectional view of the generally rounded square shaped FOF EMI gasket of FIG. 4A having been compressed between two generally planar parallel substrates.

A cross-sectional view of the gasket 300 of FIG. 4A along a plane which passes through an aperture 116, can be seen in FIG. 4B, where the gasket has been compressed between two substrates 106, 108. In this figure, the adjacent electrical components 110 are not electrically contacted by the gasket 300, which is dielectric in the x axis. But the aperture permits conductivity in the y axis between the two substrates 106, 108. The apertures 116 permit the gasket's electrically-conductive layer 102 to electrically contact the substrates 106, 108 through the apertures.

Figure 4C:
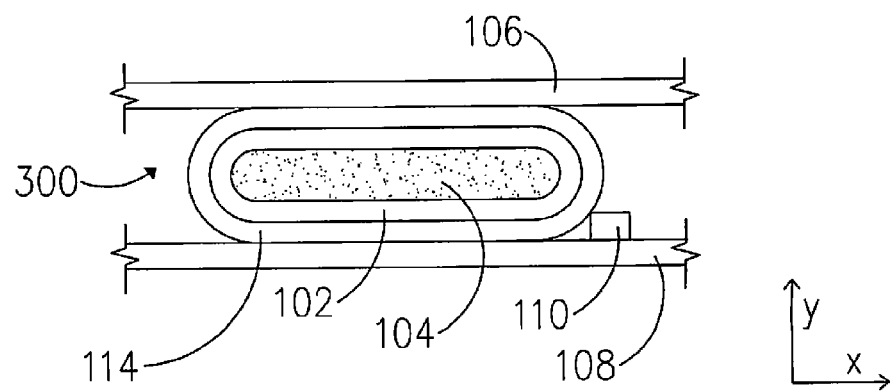
FIG. 4C depicts a cross-sectional view of the generally rounded square shaped FOF EMI gasket of FIG. 4A having been compressed between two generally planar parallel substrates.

Conversely, FIG. 4C, which shows the cross-sectional view of the gasket 300 of FIG. 4A along a plane that does not pass through an aperture, certain segments of the gasket remain dielectric in both the x axis and the y axis.

Compared to the gasket 200 of FIGS. 2A and 2B, the gasket 300 of FIGS. 4A, 4B, and 4C has less effective electrical conductivity in the y axis. Notwithstanding the dielectric material 114 that covers the electrically-conductive layer 102 (e.g., cloth, etc.) but for the apertures 116 at least partially inhibiting y axis conductivity, the inherent thickness of the dielectric material 114 requires additional compression of the two substrates 106, 108 to force the electrically-conductive portions of the gasket 300 through the apertures 116 to the substrates 106, 108, as seen in FIG. 4B.

Though FIGS. 2A and 4A respectively show the gaskets 200 and 300 each having a generally rounded-edge square-shaped cross-sectional profile, many other profile shapes are suitable. Non-limiting examples include D-shaped, P-shaped, double D shaped, double rectangle shaped, rectangle shaped, J-shaped, knife shaped, oval shaped, L-shaped, round shaped, bell shaped, C-fold shaped, and T-shaped.

Figure 5:
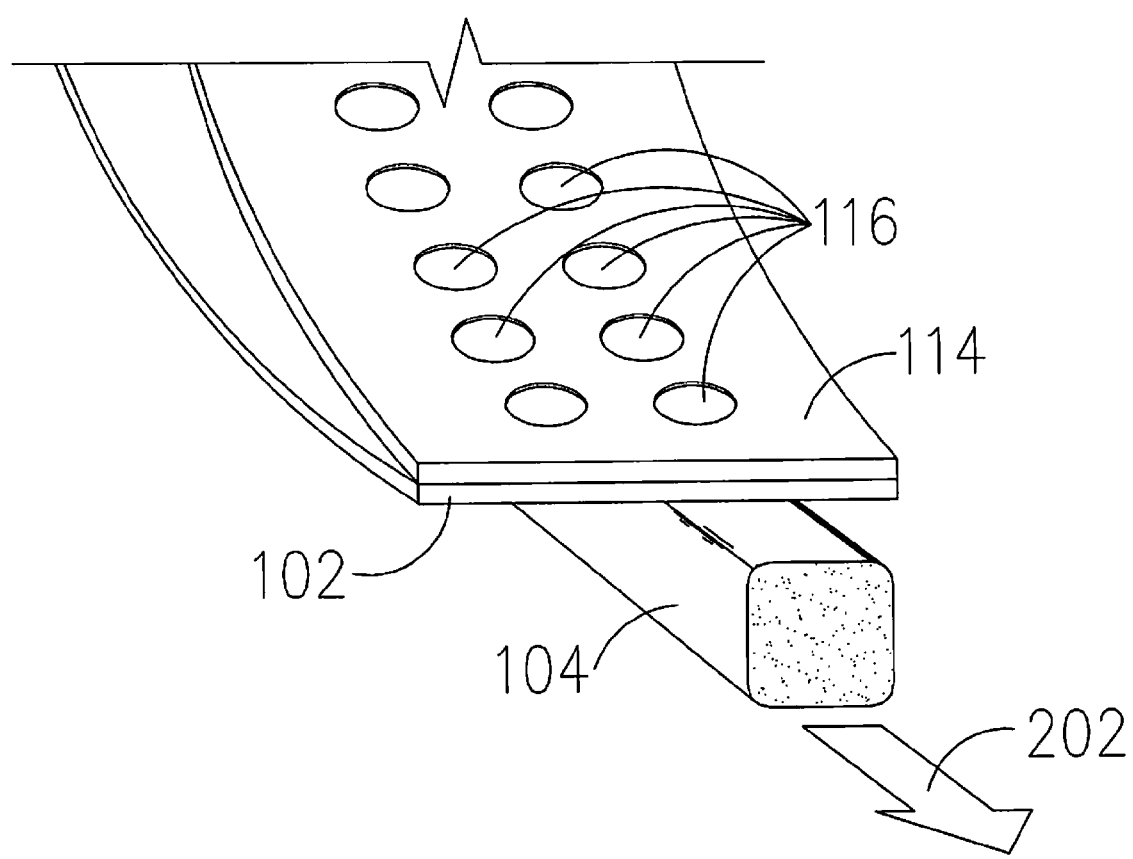
FIG. 5 depicts an embodiment of a method of manufacturing the generally rounded square shaped FOF EMI gasket having nonconductive material thereon of FIG. 4A.

The gasket 300 of FIGS. 4A, 4B, and 4C may be manufactured by any suitable method, including the embodiment depicted in FIG. 5. In this particular non-limiting embodiment, a single strip of nonconductive material 114 of a given width and a single strip of electrically-conductive cloth 102 of a slightly lesser width are fed and adhered to the foam core 104 as it moves in the production direction 202. In this embodiment, the nonconductive material 114 has been pre-perforated to create a series of apertures 116 thereon. Additionally, the circumference or perimeter of the cross-sectional shape of the foam core 104 may be equal to the width of the strip of nonconductive material 114 such that, when wrapped around the foam core 104, the nonconductive material edges meet at a tight seam or slight overlap somewhere on the gasket 300.

The resulting gasket 300 of the process seen in FIG. 5 is one where the nonconductive layer 114 surrounds the electrically-conductive layer 102, which in turn surrounds the foam core 104. The nonconductive 114 layer includes two series of apertures 116, each series of apertures being defined as a plurality of openings in the nonconductive layer 114 that expose portions of the electrically-conductive layer 102. The two series of apertures 116 run the length of the gasket 300 and are on opposite sides of the gasket 300.

In an embodiment, the resilient core member 104 may be polyurethane foam or thermoplastic elastomer foam. In an embodiment, the resilient core member 104 is any open cell foam or closed cell foam suitable for use in an EMI FOF gasket.

The conductive layer 102 may be a metalized fabric. The conductive layer 102 may be, for example, a fabric material coated with nickel/copper. In another embodiment, the conductive layer 102 is a fabric material coated with tin/copper. In another embodiment, the conductive layer 102 is metal foil, examples of which include but are not limited to, Aluminum, Copper, or Tin.

In an embodiment, such as the gasket of FIGS. 2A, 2B and 3, the layer of nonconductive material may be two strips of polyethylene terephthalate film. In another embodiment, such as the gasket of FIGS. 4A, 4B, 4C, and 5, the layer of nonconductive material may be a single strip of polyethylene film. Any suitable nonconductive material may serve as the nonconductive layer of the EMI FOF gasket, including unplated fabric, paper, or plastic.

The conductive layer 102 may be adhered to the core 104 with any suitable adhesive known in the art. In an embodiment, the adhesive may be an acrylic non-conductive pressure sensitive adhesive having a high peel strength and temperature resistance. In another embodiment, the adhesive may be an acrylic conductive pressure sensitive adhesive having an electrical conductivity. In another embodiment, the adhesive may be a solvent based polyester adhesive that is substantially halogen free and includes at least one halogen-free flame retardant.

Alternative embodiments may include other suitable materials for the core, outer layer, and/or adhesive.

The compression of the gasket 300 between the two substrates 106, 108, preferably helps the gasket 300 establish electrical conductivity with the substrates 106, 108, sufficient for EMI shielding performance.

The presence of the nonconductive materials on the gasket of FIGS. 2A, 2B, and 3 was found to have no negative effect on the performance of the gasket, while the nonconductive materials still provided dielectric performance in a perpendicular axis to prevent contact with adjacent electrical components. Both the compression forces and resistance of the partially nonconductive gasket were analogous to those of a gasket of the prior art.

In an exemplary embodiment, an electromagnetic interference gasket has a body of indefinite length. The gasket includes a core surrounded by an electrically-conductive layer, where the electrically-conductive layer is adhered to the core. A nonconductive layer is adhered to the electrically-conductive layer along one or more opposite sides of the gasket that are configured to deflect outwardly when the gasket is compressed between first and second surfaces.

The gasket may be deflectable between the first and second surfaces to provide electrical conductivity between the first and second surfaces with the nonconductive layer preventing electrical contact with and shorting out of an adjacent electrical component when the gasket is compressed and the nonconductive layer contacts the adjacent electrical component. The gasket may be compressible between the first and second surfaces into a collapsed orientation characterized in that the opposite sides of the gasket deflect generally outwardly away from each other as the gasket transitions from a non-compressed state into the collapsed orientation.

The opposite sides of the gasket may deflect generally outwardly away from each other when the gasket is compressed between the first and second surfaces such that the gasket has a wider and shorter profile than the profile of the gasket in a non-compressed state. The gasket includes a top, a bottom, and the opposite sides that collectively define a generally rounded-edge square-shaped profile in a non-compressed state and a generally oval-shaped profile when the gasket is compressed between the first and second surfaces.

The nonconductive layer may comprise nonconductive material that is along only the opposite sides of the gasket running the length of the body of the gasket such that the electrically-conductive layer along a top and a bottom of the gasket is exposed and not covered by the nonconductive material. The gasket may be deflectable between the first and second surfaces, where the electrically-conductive layer along the top and the bottom provides electrical conductivity between the first and second surfaces and the nonconductive material along only the opposite sides prevent electrical contact with and shorting out against adjacent electrical components when the gasket is compressed and the nonconductive material contacts the adjacent electrical components.

In an exemplary embodiment, there is a method of manufacturing an electromagnetic interference gasket having a body of indefinite length. In this example, the method comprises surrounding a foam core of indefinite length with an electrically-conductive layer and adhering the electrically-conductive layer to the core; and adhering a nonconductive layer to the electrically-conductive layer along one or more opposite sides of the gasket that are configured to deflect outwardly when the gasket is compressed between first and second surfaces.

The step of adhering a nonconductive layer may comprise feeding two strips of dielectric material from respective spools and adhering the two strips of dielectric material to the electrically-conductive layer along the opposite sides of the gasket as the gasket moves in a production direction. The gasket may be deflectable between the first and second surfaces to provide electrical conductivity between the first and second surfaces with the nonconductive layer preventing electrical contact with and shorting out of an adjacent electrical component when the gasket is compressed and the nonconductive layer contacts the adjacent electrical component.

The gasket may be compressible between the first and second surfaces into a collapsed orientation characterized in that the opposite sides of the gasket deflect generally outwardly away from each other as the gasket transitions from a non-compressed state into the collapsed orientation. The opposite sides of the gasket may deflect generally outwardly away from each other when the gasket is compressed between the first and second surfaces such that the gasket has a wider and shorter profile than the profile of the gasket in a non-compressed state. The gasket may include a top, a bottom, and the opposite sides that collectively define a generally rounded-edge square-shaped profile in a non-compressed state and a generally oval-shaped profile when the gasket is compressed between the first and second surfaces.

The step of adhering a nonconductive layer may comprise adhering nonconductive material along only the opposite sides of the gasket running the length of the body of the gasket such that the electrically-conductive layer along a top and a bottom of the gasket is exposed and not covered by the nonconductive material. The gasket may be deflectable between the first and second surfaces, where the electrically-conductive layer along the top and the bottom provides electrical conductivity between the first and second surfaces and the nonconductive material along the opposite sides prevent electrical contact with and shorting out against adjacent electrical components when the gasket is compressed and the nonconductive material contacts the adjacent electrical components.

In another exemplary embodiment, a method comprises compressing an electromagnetic interference gasket between first and second surfaces such that opposite sides of the gasket deflect outwardly. The gasket comprises a core surrounded by an electrically-conductive layer that is adhered to the core. A nonconductive layer is adhered to the electrically-conductive layer along one or more of the opposite sides of the gasket. The gasket may provide electrical conductivity between the first and second surfaces with the nonconductive layer preventing electrical contact with and shorting out of an adjacent electrical component in contact with the nonconductive layer.

The nonconductive layer may comprise nonconductive material that is along only the opposite sides of the gasket running a length of a body of the gasket such that the electrically-conductive layer along a top and a bottom of the gasket is exposed and not covered by the nonconductive material. The step of compressing the gasket may comprise causing the opposite sides of the gasket to deflect generally outwardly away from each other such that the gasket widens or expands in width, and contacting the electrically-conductive layer along the top and the bottom with the first and second surfaces to provide electrical conductivity between the first and second surfaces. The nonconductive material along the opposite sides may prevent electrical contact with and shorting out of adjacent electrical components that contact the nonconductive material.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally," "about," and "substantially," may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

We claim:

1. An electromagnetic interference gasket comprising a body of indefinite length and including:
    a core surrounded by an electrically-conductive layer, where the electrically-conductive layer is adhered to the core; and
    a nonconductive layer adhered to the electrically-conductive layer along one or more opposite sides of the gasket that are configured to deflect outwardly when the gasket is compressed between first and second surfaces;
    wherein a printed circuit board includes the first surface;
    wherein the gasket is deflectable between the printed circuit board and the second surface to provide electrical conductivity between the first surface of the printed circuit board and the second surface with the nonconductive layer preventing electrical contact with and shorting out of an adjacent electrical component on the first surface of the printed circuit board when the gasket is compressed and the nonconductive layer contacts the adjacent electrical component.

2. The gasket of claim 1, wherein the gasket is compressible between the first and second surfaces into a collapsed orientation characterized in that the opposite sides of the gasket deflect generally outwardly away from each other as the gasket transitions from a non-compressed state into the collapsed orientation.

3. The gasket of claim 1, wherein the opposite sides of the gasket deflect generally outwardly away from each other when the gasket is compressed between the first and second surfaces such that the gasket has a wider and shorter profile than the profile of the gasket in a non-compressed state.

4. The gasket of claim 3, wherein the gasket includes a top, a bottom, and the opposite sides that collectively define a generally rounded-edge square-shaped profile in a non-compressed state and a generally oval-shaped profile when the gasket is compressed between the first and second surfaces.

5. The gasket of claim 1, wherein:
    the gasket is electrically conductive in one direction perpendicular to the length of the gasket; and
    the gasket is nonconductive in a second direction perpendicular to both the one direction and the length of the gasket.

6. The gasket of claim 1, wherein the nonconductive layer comprises at least one strip of nonconductive material along each of the opposite sides of the gasket running the length of the body of the gasket.

7. The gasket of claim 1, wherein:
    the nonconductive layer comprises nonconductive material that is along only the opposite sides of the gasket running the length of the body of the gasket such that the electrically-conductive layer along a top and a bottom of the gasket is exposed and not covered by the nonconductive material; and
    the gasket is deflectable between the first and second surfaces, where the electrically-conductive layer along the top and the bottom provides electrical conductivity between the first and second surfaces and the nonconductive material along only the opposite sides prevent electrical contact with and shorting out against adjacent electrical components when the gasket is compressed and the nonconductive material contacts the adjacent electrical components.

8. The gasket of claim 1, wherein:
    the electrically-conductive layer comprises fabric coated with nickel and/or copper;
    the resilient core member comprises polyurethane foam, and further comprising an adhesive disposed between the fabric and the foam; and
    the nonconductive layer comprises plastic film.

9. The gasket of claim 8, wherein the plastic film is polyethylene terephthalate film.

10. A method of manufacturing an electromagnetic interference gasket having a body of indefinite length, the method comprising;
    surrounding a foam core of indefinite length with an electrically-conductive layer and adhering the electrically-conductive layer to the core; and
    adhering a nonconductive layer to the electrically-conductive layer along one or more opposite sides of the gasket that are configured to deflect outwardly when the gasket is compressed between first and second surfaces;
    wherein a printed circuit board includes the first surface;
    wherein the gasket is deflectable between the printed circuit board and the second surface to provide electrical conductivity between the first surface of the printed circuit board and the second surface with the nonconductive layer preventing electrical contact with and shorting out of an adjacent electrical component on the printed circuit board when the gasket is compressed and the nonconductive layer contacts the adjacent electrical component.

11. The method of claim 10, wherein adhering a nonconductive layer comprises feeding two strips of dielectric material from respective spools and adhering the two strips of dielectric material to the electrically-conductive layer along the opposite sides of the gasket as the gasket moves in a production direction.

12. The method of claim 10, where the gasket is deflectable between the first and second surfaces to provide electrical conductivity between the first and second surfaces with the nonconductive layer preventing electrical contact with and shorting out of an adjacent electrical component when the gasket is compressed and the nonconductive layer contacts the adjacent electrical component.

13. The method of claim 10, wherein the gasket is compressible between the first and second surfaces into a collapsed orientation characterized in that the opposite sides of the gasket deflect generally outwardly away from each other as the gasket transitions from a non-compressed state into the collapsed orientation.

14. The method of claim 10, wherein the opposite sides of the gasket deflect generally outwardly away from each other when the gasket is compressed between the first and second surfaces such that the gasket has a wider and shorter profile than the profile of the gasket in a non-compressed state.

15. The method of claim 10, wherein the gasket includes a top, a bottom, and the opposite sides that collectively define a generally rounded-edge square-shaped profile in a non-compressed state and a generally oval-shaped profile when the gasket is compressed between the first and second surfaces.

16. The method of claim 10, wherein:
adhering a nonconductive layer comprises adhering nonconductive material along only the opposite sides of the gasket running the length of the body of the gasket such that the electrically-conductive layer along a top and a bottom of the gasket is exposed and not covered by the nonconductive material; and
the gasket is deflectable between the first and second surfaces, where the electrically-conductive layer along the top and the bottom provides electrical conductivity between the first and second surfaces and the nonconductive material along the opposite sides prevent electrical contact with and shorting out against adjacent electrical components when the gasket is compressed and the nonconductive material contacts the adjacent electrical components.

17. The method of claim 10, wherein:
the electrically-conductive layer comprises fabric coated with nickel and/or copper;
the resilient core member comprises polyurethane foam, and further comprising an adhesive disposed between the fabric and the foam; and
the nonconductive layer comprises plastic film.

18. A method comprising compressing an electromagnetic interference gasket between a first surface of a printed circuit board and a second surface such that opposite sides of the gasket deflect outwardly, wherein the gasket comprises a core surrounded by an electrically-conductive layer that is adhered to the core, and a nonconductive layer adhered to the electrically-conductive layer along one or more of the opposite sides of the gasket, whereby the gasket provides electrical conductivity between the first and second surfaces with the nonconductive layer preventing electrical contact with and shorting out of an adjacent electrical component on the printed circuit board in contact with the nonconductive layer.

19. The method of claim 18, wherein:
the nonconductive layer comprises nonconductive material that is along only the opposite sides of the gasket running a length of a body of the gasket such that the electrically-conductive layer along a top and a bottom of the gasket is exposed and not covered by the nonconductive material; and
compressing the gasket comprises causing the opposite sides of the gasket to deflect generally outwardly away from each other such that the gasket widens or expands in width, contacting the electrically-conductive layer along the top and the bottom with the first and second surfaces to provide electrical conductivity between the first and second surfaces, whereby the nonconductive material along the opposite sides prevent electrical contact with and shorting out of adjacent electrical components that contact the nonconductive material.

\* \* \* \* \*